United States Patent
Chen

(10) Patent No.: US 10,276,778 B2
(45) Date of Patent: *Apr. 30, 2019

(54) CRYSTAL PATTERN FORMING METHOD, PIEZOELECTRIC FILM PRODUCING METHOD, PIEZOELECTRIC ELEMENT PRODUCING METHOD, AND LIQUID DISCHARGING HEAD PRODUCING METHOD

(71) Applicant: Ricoh Company, Ltd., Tokyo (JP)

(72) Inventor: Xianfeng Chen, Kanagawa (JP)

(73) Assignee: Ricoh Company, Ltd., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/673,611

(22) Filed: Aug. 10, 2017

(65) Prior Publication Data

US 2017/0365776 A1    Dec. 21, 2017

Related U.S. Application Data

(63) Continuation of application No. PCT/JP2015/085025, filed on Dec. 15, 2015.

(30) Foreign Application Priority Data

Feb. 17, 2015 (JP) ................. 2015-028865

(51) Int. Cl.
*B05D 3/00* (2006.01)
*C08J 7/18* (2006.01)
(Continued)

(52) U.S. Cl.
CPC ............... *H01L 41/39* (2013.01); *B41J 2/14* (2013.01); *B41J 2/16* (2013.01); *B41J 2/161* (2013.01);
(Continued)

(58) Field of Classification Search
CPC ..... H01L 41/39; H01L 41/09; H01L 41/1132; H01L 41/1134; H01L 41/183;
(Continued)

(56) References Cited

U.S. PATENT DOCUMENTS 7,544,244 B2 * 6/2009 Sakashita ............... C23C 24/04
117/5
9,202,717 B2 12/2015 Takeuchi et al.
(Continued)

FOREIGN PATENT DOCUMENTS

JP    H06-177035    6/1994
JP    2003-174147   6/2003
(Continued)

OTHER PUBLICATIONS

International Search Report dated Mar. 8, 2016 in PCT/JP2015/085025 filed on Dec. 15, 2015.
(Continued)

*Primary Examiner* — Michael P Wieczorek
(74) *Attorney, Agent, or Firm* — IPUSA, PLLC

(57) ABSTRACT

A crystal pattern forming method includes: an electromagnetic wave absorbing layer forming process for forming an electromagnetic wave absorbing layer on one of surfaces of a substrate; an amorphous film forming process for forming an amorphous film on the electromagnetic wave absorbing layer; a mask forming process for forming an electromagnetic wave blocking mask for blocking an electromagnetic wave on the other one of the surfaces of the substrate; and a crystallizing process for causing the substrate to be irradiated with the electromagnetic wave from the other one of the surfaces of the substrate through the electromagnetic wave blocking mask to crystallize a given region in the amorphous film. In the mask forming process, a recessed structure is formed on the other one of the surfaces of the (Continued)

substrate, by selectively removing the other one of the surfaces of the substrate to form a recessed portion.

8 Claims, 19 Drawing Sheets

(51) Int. Cl.
    *G21H 5/00*     (2006.01)
    *H01L 41/39*     (2013.01)
    *B41J 2/14*     (2006.01)
    *B41J 2/16*     (2006.01)
    *H01L 41/09*     (2006.01)
    *H01L 41/113*     (2006.01)
    *H01L 41/18*     (2006.01)
    *H01L 21/02*     (2006.01)
    *H01L 41/318*     (2013.01)
    *H01L 37/02*     (2006.01)

(52) U.S. Cl.
    CPC .......... *B41J 2/1628* (2013.01); *B41J 2/1629* (2013.01); *B41J 2/1631* (2013.01); *B41J 2/1634* (2013.01); *B41J 2/1642* (2013.01); *B41J 2/1645* (2013.01); *B41J 2/1646* (2013.01); *H01L 21/02345* (2013.01); *H01L 41/09* (2013.01); *H01L 41/1132* (2013.01); *H01L 41/1134* (2013.01); *H01L 41/183* (2013.01); *H01L 41/318* (2013.01); *H01L 37/02* (2013.01); *H01L 41/0973* (2013.01)

(58) Field of Classification Search
    CPC .... H01L 41/318; B41J 2/14; B41J 2/16; B41J 2/161; B41J 2/1628; B41J 2/1629; B41J 2/1631; B41J 2/1634; B41J 2/1642; B41J 2/1645
    See application file for complete search history.

(56) References Cited

U.S. PATENT DOCUMENTS

| | | | |
|---|---|---|---|
| 9,583,694 | B2* | 2/2017 | Chen |
| 2004/0016952 | A1 | 1/2004 | Sawasaki |
| 2004/0080991 | A1 | 4/2004 | Sawasaki |
| 2006/0125352 | A1 | 6/2006 | Sakashita et al. |
| 2011/0117731 | A1 | 5/2011 | Park et al. |
| 2014/0216643 | A1 | 8/2014 | Chen |
| 2014/0268481 | A1 | 9/2014 | Akiyama et al. |
| 2015/0068673 | A1* | 3/2015 | Chen .................. B41J 2/161 156/273.3 |
| 2016/0023466 | A1 | 1/2016 | Chen |

FOREIGN PATENT DOCUMENTS

| | | |
|---|---|---|
| JP | 2003-298020 | 10/2003 |
| JP | 2003-298021 | 10/2003 |
| JP | 2005-349714 | 12/2005 |
| JP | 2006-188046 | 7/2006 |
| JP | 2007-266141 | 10/2007 |
| JP | 2007-305779 | 11/2007 |
| JP | 2007-329414 | 12/2007 |
| JP | 2009-054657 | 3/2009 |
| JP | 2011-109073 | 6/2011 |
| JP | 2012-114156 | 6/2012 |
| JP | 2014-154581 | 8/2014 |
| JP | 2014-220331 | 11/2014 |
| JP | 2015-056551 | 3/2015 |
| WO | 2012/023416 | 2/2012 |

OTHER PUBLICATIONS

Extended European Search Report for 15882739.4 dated May 4, 2018.

Office Action dated Aug. 21, 2018 issued with respect to the corresponding Japanese Patent Application No. 2017-500296.

* cited by examiner

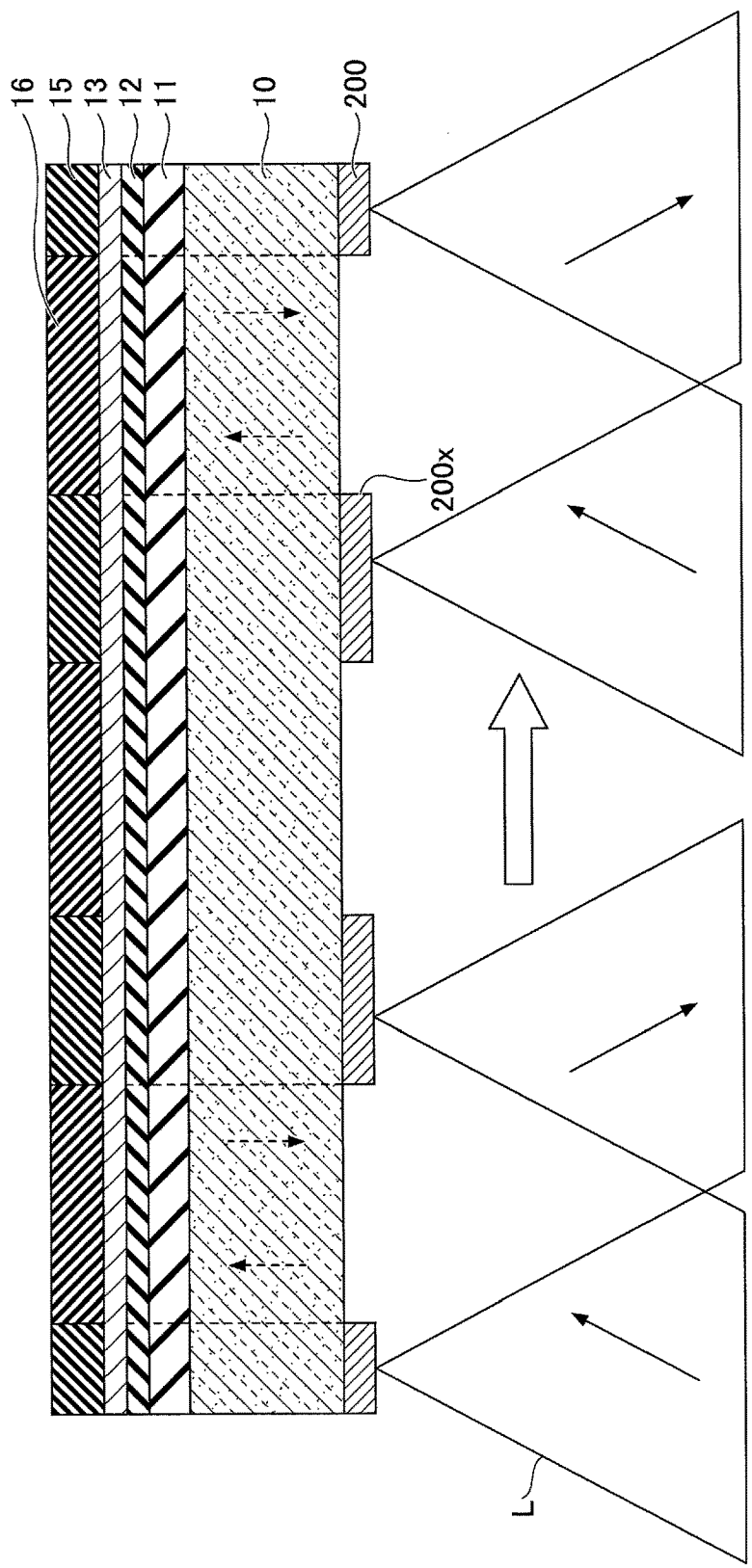

1

CRYSTAL PATTERN FORMING METHOD, PIEZOELECTRIC FILM PRODUCING METHOD, PIEZOELECTRIC ELEMENT PRODUCING METHOD, AND LIQUID DISCHARGING HEAD PRODUCING METHOD

CROSS-REFERENCE TO RELATED APPLICATIONS

The present application is a continuation application of International Application No. PCT/JP2015/085025, filed Dec. 15, 2015, which claims priority to Japanese Patent Application No. 2015-028865, filed Feb. 17, 2015. The contents of these applications are incorporated herein by reference in their entirety.

BACKGROUND OF THE INVENTION

1. Field of the Invention

The disclosure herein generally relates to a crystal pattern forming method, a piezoelectric film producing method, a piezoelectric element producing method, and a liquid discharging head producing method.

2. Description of the Related Art

Piezoelectric elements have a property of converting between an electric signal and a displacement or a pressure, and are thus used in various devices including sensors, actuators, and the like. For example, PZT is used as a piezoelectric element. As a method for forming a PZT crystal film (a piezoelectric film), for example, there is a method for forming an amorphous PZT film on a substrate in a sol-gel method (a CSD method), in a sputtering method, or in a CVD method, and heating the amorphous PZT film in an electric furnace, for example, to crystallize the amorphous PZT film.

SUMMARY OF THE INVENTION

In one example, a crystal pattern forming method includes: an electromagnetic wave absorbing layer forming process for forming an electromagnetic wave absorbing layer on one of surfaces of a substrate; an amorphous film forming process for forming an amorphous film on the electromagnetic wave absorbing layer; a mask forming process for forming an electromagnetic wave blocking mask for blocking an electromagnetic wave on the other one of the surfaces of the substrate; and a crystallizing process for causing the substrate to be irradiated with the electromagnetic wave from the other one of the surfaces of the substrate through the electromagnetic wave blocking mask to crystallize a given region in the amorphous film. In the mask forming process, a recessed structure is formed on the other one of the surfaces of the substrate, by selectively removing the other one of the surfaces of the substrate to form a recessed portion. According to an aspect of the disclosure, a method for forming a crystal pattern at a desired position with high accuracy is provided.

BRIEF DESCRIPTION OF THE DRAWINGS

FIG. 15 is a cross-sectional view for illustrating a crystal pattern forming method in an eleventh embodiment.

DESCRIPTION OF THE EMBODIMENTS

In the previously described related art, in a case where the PZT crystal film is produced in the method as described above, not only the amorphous PZT film is heated but the entire substrate is also heated. For this reason, a heat-resistant substrate needs to be used. In addition, in a case where another structure or element is also arranged on the substrate, another component (such as the above-described another structure or element) that does not need a heating process is also heated. This might cause thermal damage or a misalignment in dimension accuracy due to thermal stress, and thus might decrease the property drastically.

Hence, a method for locally heating a given region has been proposed, instead of heating the entire substrate. For example, a technique for forming a PZT crystal film is disclosed, by forming an amorphous PZT film on a silicon substrate covered with a platinum film, and locally heating the amorphous PZT film using a laser beam that is transmissive through the silicon substrate to crystallize the amorphous PZT film (e.g., see Japanese Unexamined Patent Application Publication No. 2014-154581).

In the above-described technique, however, when a piezoelectric element is integrated with another device on a single substrate, it is difficult to control a scanned position by the laser beam. In addition, since an area scanned by the laser beam depends on the beam size of the laser beam, the scanned area cannot be changed flexibly. Consequently, it becomes difficult to form a crystal pattern of the PZT crystal film at a desired position with high accuracy.

The present disclosure has been made in view of the above circumstances, and has an object to provide a method for forming a crystal pattern at a desired position with high accuracy.

In the following, embodiments of the present disclosure will be described with reference to the accompanying drawings. In each of the drawings, components that are identical components to those previously defined are referred to by the same numerals; accordingly, their descriptions are omitted in some cases.

First Embodiment

In a first embodiment, a case where a silicon substrate is used as one example of a substrate is illustrated, and a case where a laser beam is used as one example of an electromagnetic wave is illustrated. However, the first embodiment is not limited to these cases. In addition, for sake of simplicity, a surface of the substrate on which an electromagnetic wave absorbing layer is formed may be referred to as one surface of the substrate, whereas a surface on which an electromagnetic wave blocking layer is formed may be referred to as the other surface of the substrate.

Figure 1A:
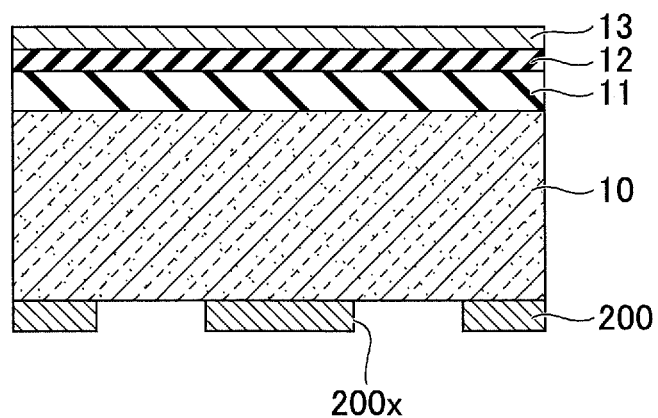
FIG. 1A is a cross-sectional view for illustrating a crystal pattern forming method in a first embodiment.
Figure 1B:
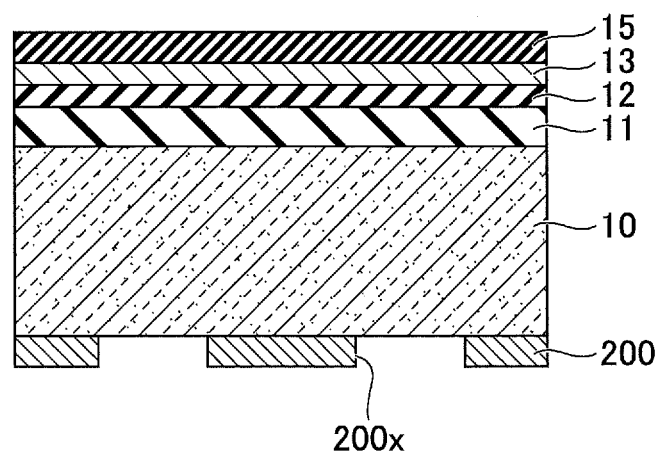
FIG. 1B is another cross-sectional view for illustrating the crystal pattern forming method in the first embodiment.
Figure 1C:
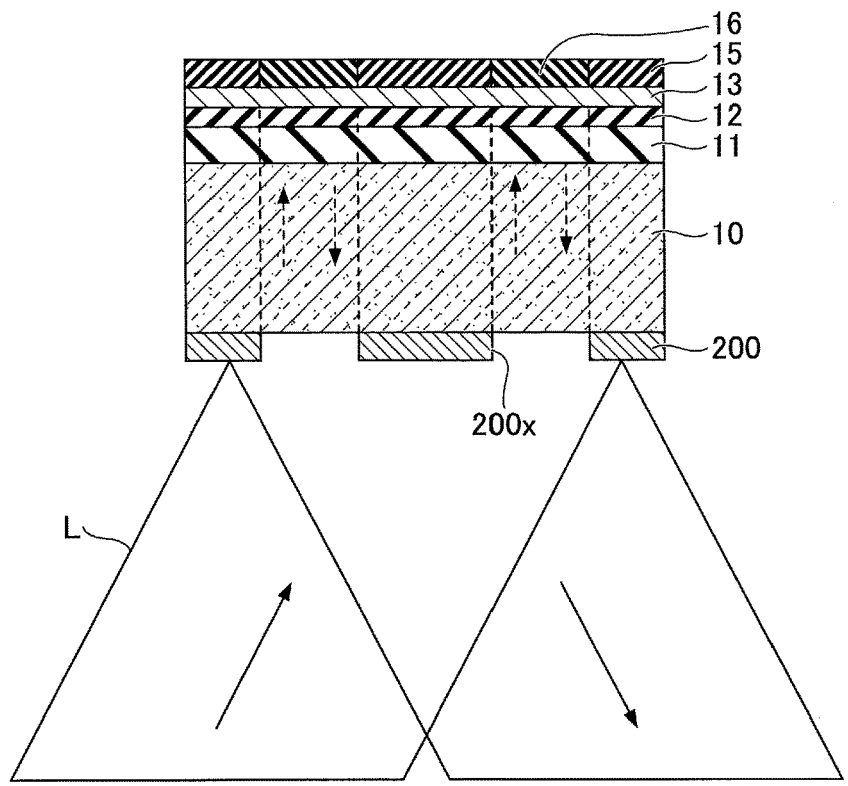
FIG. 1C is further another cross-sectional view for illustrating the crystal pattern forming method in the first embodiment.

FIG. 1A to FIG. 1C are cross-sectional views for illustrating a crystal pattern forming method in the first embodiment. First, in a process illustrated in FIG. 1A, a silicon substrate 10 having a thickness of approximately 500 μm is prepared. Subsequently, on a front surface side (one surface side) of the silicon substrate 10, a silicon oxide film ($SiO_2$ film) 11, a titanium oxide film ($TiO_x$ film) 12, and a first metal film 13 are sequentially stacked. Note that in the present embodiment, one example where a platinum film (Pt film) is used as the first metal film 13 is illustrated.

To be specific, on the front surface of the silicon substrate 10, the silicon oxide film 11 having a thickness of approximately 600 nm is formed by a Chemical Vapor Deposition (CVD) method or a thermal oxidation method. Subsequently, on the silicon oxide film 11, the titanium oxide film 12 having a thickness of approximately 50 nm is stacked by, for example, a sputtering method or a CVD method. Furthermore, on the titanium oxide film 12, for example, by a sputtering method or a CVD method, a platinum film having a thickness of approximately 100 nm is stacked as the first metal film 13.

Note that the first metal film 13 has a function as the electromagnetic wave absorbing layer for absorbing an electromagnetic wave with which the silicon substrate 10 is irradiated from a back surface side (the other surface side) of the silicon substrate 10, and for heating a target layer to be heated (such as an amorphous PZT film) that is formed on the first metal film 13. Therefore, the first metal film 13 needs to be formed on a lower side of the target layer to be heated.

Further, on the back surface of the silicon substrate 10, an electromagnetic wave blocking layer 200 having opening portions 200x is formed. To be specific, on the entire back surface of the silicon substrate 10, the electromagnetic wave blocking layer 200 is formed by, for example, a sputtering method or a vacuum vapor deposition method. Then, the electromagnetic wave blocking layer 200 is partially removed by a photolithography method or an etching method to form the opening portions 200x. The locations or shapes of the opening portions 200x can be determined to correspond to a crystal pattern desired to be formed. One or more opening portions 200x may be arranged.

The material of the electromagnetic wave blocking layer 200 may be any material as long as it has a low transmission rate (any material having light-blocking function) with respect to the electromagnetic wave with which the silicon substrate 10 is irradiated from the back surface side of the silicon substrate 10. As a material of the electromagnetic wave blocking layer 200, for example, a metal such as Cr can be used. The film thickness of the electromagnetic wave blocking layer 200 can be, for example, approximately 200 nm. Ni, Pt, Rh, or the like may be used as the material of the electromagnetic wave blocking layer 200, instead of Cr. Note that the electromagnetic wave blocking layer 200 is one representative example of an electromagnetic wave blocking mask, according to an aspect of the present disclosure.

Next, in a process illustrated in FIG. 1B, for example, by a CSD method, an amorphous PZT film 15 is formed on the first metal film 13. To be specific, for example, lead acetate, zirconium alkoxide, and a titanium alkoxide compound, which serve as starting materials, are dissolved into methoxyethanol, which serves as a common solvent, to be synthesized into a PZT precursor solution (a PZT sol-gel liquid), which serves as a homogeneous solvent. After a seed layer is formed using $PbTiO_3$ on the first metal film 13, for example, by a spin coating method, the synthesized PZT precursor solution (the PZT sol-gel liquid) is applied on the seed layer to form a PZT applied film. The composite oxide solid concentration of the synthesized PZT precursor solution can be substantially equal to or lower than 0.5 moles/liter, for example. However, the seed layer is not necessarily formed, and the PZT applied film may be formed directly on the first metal film 13, without the seed layer being formed.

Then, the silicon substrate 10 with the PZT applied film that is formed on the first metal film 13 is placed on, for example, a hot plate (not illustrated), and is heated to have a given temperature (e.g., approximately 220 degrees Celsius). This evaporates the solvent and thermally decomposes the PZT applied film, thereby resulting in a solid-state amorphous PZT film 15 (an amorphous film).

Next, in a process illustrated in FIG. 1C, from the back surface side (the other surface side) of the silicon substrate 10, through the electromagnetic wave blocking layer 200, the silicon substrate 10 is irradiated with, for example, a continuously oscillating laser beam L to crystallize a given region of the amorphous PZT film 15, and thus a PZT crystal film 16 is formed.

Regarding the wavelength of the laser beam L, any wavelength that is easily absorbed by the first metal film 13 serving as the electromagnetic wave absorbing layer can be selected as appropriate. However, in the present embodiment, as one example, the wavelength is set to equal to or larger than 1200 nm (e.g., 1470 nm). Note that the laser beam L can be configured to have, for example, a flat top beam profile with a flat leading end of a beam shape.

The laser beam L transmits through the opening portions 200x of the electromagnetic wave blocking layer 200, and reaches the first metal film 13. The platinum film used as the first metal film 13 in the present embodiment has a very large absorption coefficient with respect to wavelengths equal to or larger than 1200 nm, such that the absorption coefficient is approximately $6 \times 10^5$ cm$^{-1}$. In addition, for example, in the platinum film having a film thickness of 100 nm, the transmission rate of light having a wavelength of approximately 1200 nm is equal to or smaller than 1%. Therefore, the optical energy of the laser beam L having the wavelength of approximately 1200 nm with which the silicon substrate 10 has been irradiated is substantially absorbed by the first metal film 13 serving as the platinum film.

The optical energy of the laser beam L that has been absorbed by the first metal film 13 becomes thermal energy, and the thermal energy heats the first metal film 13. In the first metal film 13, heat distributions corresponding to the shapes of the opening portions 200x of the electromagnetic wave blocking layer 200 are produced. The heat distributions of the first metal film 13 transfer (spread) to the amorphous PZT film 15 formed on one surface of the first metal film 13, and the amorphous PZT film 15 is locally heated from the first metal film 13 side. This changes the film property of a heated portion of the amorphous PZT film 15 (crystallizes the amorphous PZT film 15). Thus, the PZT crystal film 16 is formed. Note that continuous heating increases grain sizes of crystal grains in the PZT crystal film 16, and thus improves crystal qualities.

Crystallization temperature of a typical amorphous PZT film ranges from approximately 600 degrees Celsius to approximately 850 degrees Celsius, and is considerably lower than the melting point of platinum (1768 degrees Celsius). Hence, by controlling an energy density and an irradiating duration of the laser beam L that is incident to the first metal film 13, the amorphous PZT film 15 is locally heated and crystallized, with no damage to the first metal film 13, so as to form a crystal pattern. The energy density of the laser beam L can be set to, for example, approximately $1 \times 10^2$ W/cm$^2$ to $1 \times 10^6$ W/cm$^2$. An irradiating duration can be set to, for example, approximately 1 ms to 200 ms.

In the crystal pattern forming method in the first embodiment, as described above, the amorphous PZT film 15 serving as the target layer to be heated is formed on one surface of the first metal film 13 serving as the electromagnetic wave absorbing layer. From the other surface side of the silicon substrate 10, through the electromagnetic wave blocking layer 200, the silicon substrate 10 is locally irradiated with the laser beam L having a wavelength to be easily absorbed by the first metal film 13.

This irradiation causes the first metal film 13 serving as the electromagnetic wave absorbing layer to absorb the optical energy of the laser beam L, and locally heats the first metal film 13, and also locally heats the amorphous PZT film 15 stacked on the electromagnetic wave absorbing layer. In such a locally heated portion in the amorphous PZT film 15, the film property is changed (crystallized) and the PZT crystal film 16 is formed. That is to say, the crystal pattern of the PZT crystal film 16 is formed corresponding to the size and location of the opening portion 200x of the electromagnetic wave blocking layer 200. Since the opening portion 200x is formed at a desired location in the electromagnetic wave blocking layer 200 with high accuracy, the crystal pattern of the PZT crystal film 16 is also formed at a desired location with high accuracy.

Figure 10A:
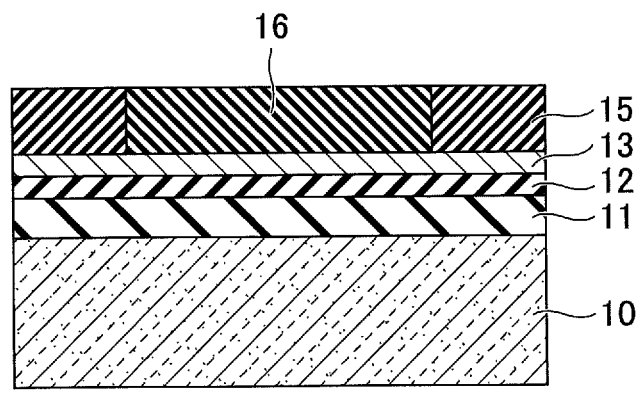
FIG. 10A is a cross-sectional view for illustrating a crystal pattern forming method in the seventh embodiment.

In addition, in the crystal pattern forming method in the first embodiment, as illustrated in FIG. 10, there is no limitation in the beam size of the laser beam L. Hence, by using a laser beam with a large beam width, crystal patterns having different sizes are collectively formed at a plurality of locations. Moreover, since the electromagnetic wave blocking layer 200 is formed on the back surface of the silicon substrate 10, even with an intensity distribution occurring in proximity to the laser beam L, the crystal pattern with high accuracy is formed by using a flat portion in the profile of the laser beam L.

Note that in the present embodiment, an example of forming the crystal pattern of the PZT crystal film has been illustrated. However, other than the PZT crystal film, an ABO$_3$ perovskite-type crystal film may be used. Such an ABO$_3$ perovskite-type crystal film may be a ferroelectric that contains lead, or may also be a ferroelectric that does not contain lead. As the ABO$_3$ perovskite-type crystal film other than the PZT crystal film, for example, a lead-free composite oxide film such as barium titanate can be used. In this case, a barium alkoxide compound and a titanium alkoxide compound are used as the starting materials and are dissolved in a common solvent, so that a barium titanate precursor solution can be produced.

These materials are expressed in a general chemical formula ABO$_3$, which corresponds to a composite oxide with main components A=Pb, Ba, or Sr, and B=Ti, Zr, Sn, Ni, Mg, or Nb. Specific expressions of such a composite oxide include (Pb1-x,Ba) (Zr,Ti)O$_3$ and (Pb1-x,Sr) (Zr,Ti)O$_3$, where part of Pb in the A site is substituted by Ba or Sr. Such a substitution is enabled with a divalent element, and has an effect of avoiding a property decrease caused by evaporation of the lead during the heating process.

Further, in the present embodiment, an example of using the laser beam L with the large width and the flat top beam profile has been illustrated. However, a laser beam with a Gaussian beam profile may be used. Moreover, in the present embodiment, an example of using the continuously oscillating laser beam L has been illustrated, but a pulse oscillation laser beam may also be used.

In the present embodiment, an example of using the platinum film for the first metal film 13 serving as the electromagnetic wave absorbing layer has been described. However, for the first metal film 13, another heat-resistant film having a higher melting point than a crystallization temperature of PZT (approximately 650 degrees Celsius)

may be used. As such another heat-resistant film, for example, a metal film including any one of metals Ir, Pd, Rh, W, Fe, Ta, Ti, Cr, Ni, Zr, Au, and Cu can be mentioned. Alternatively, a metal oxide including at least one of metal elements selected from La, Ni, Ir, Ti, Zn, Ru, Sr, Ca, Zr, Mo, Mn, Fe, Co, Sn, Sb, Bi, W, and Ta, or a composite structure including any one of the above metals and the above metal oxide can be mentioned.

In the present embodiment, a laser beam L having a width larger than the opening portion 200x has been illustrated and described. However, the width of the laser beam L may also be narrower than the opening portion 200x. By scanning and irradiating the opening portion 200x with the laser beam L a number of times appropriately in an overlapping manner, the same effect is available.

In the present embodiment, an example of forming the electromagnetic wave blocking layer 200 to be in contact with the back surface of the silicon substrate 10 has been illustrated. However, the electromagnetic wave blocking layer 200 may also be formed to be separated from the back surface of the silicon substrate 10. In this case, another layer serving as a spacer is provided between the back surface of the silicon substrate 10 and the electromagnetic wave blocking layer 200. In this case, a large quantity of wafers that become the silicon substrates 10 are processed using a single mask, so that simplification of the process is enabled. In addition, a provision of a lens between the mask and the wafer enables changes in process size as well as process shape, so that various processing approaches are available.

Second Embodiment

In a second embodiment, an example of forming a PZT crystal film on a substrate on which a semiconductor element is mounted will be illustrated. Note that in the second embodiment, descriptions of components that are identical components to those previously defined are omitted in some cases.

FIG. 2A to FIG. 3B are cross-sectional views for illustrating a crystal pattern forming method in the second embodiment. First, in a process illustrated in FIG. 2A, in a similar manner to the process illustrated in FIG. 1A, on the front surface side of the silicon substrate 10, the silicon oxide film 11, the titanium oxide film 12, and the first metal film 13 (the Pt film) are sequentially stacked. In addition, on the back surface of the silicon substrate 10, the electromagnetic wave blocking layer 200 with the opening portion 200x is formed. Note that the present embodiment is different from the first embodiment in that a semiconductor element 30 is mounted on the front surface side of the silicon substrate 10.

Figure 2A:
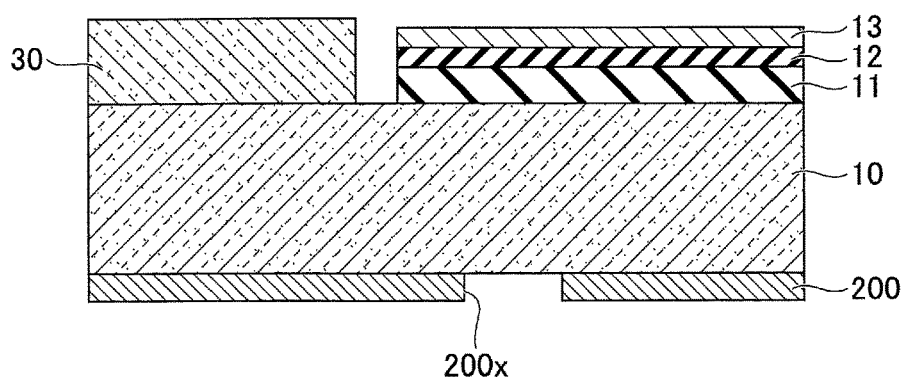
FIG. 2A is a cross-sectional view for illustrating a crystal pattern forming method in a second embodiment.
Figure 2B:
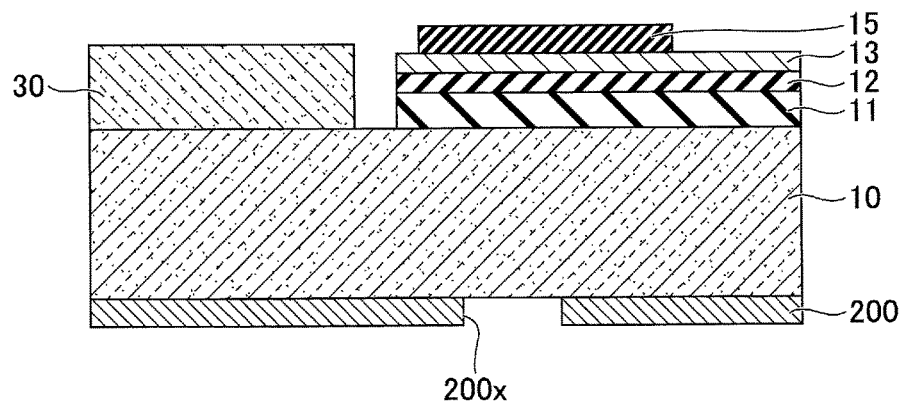
FIG. 2B is another cross-sectional view for illustrating the crystal pattern forming method in the second embodiment.

Next, in a process illustrated in FIG. 2B, in a similar manner to the process illustrated in FIG. 1B, the amorphous PZT film 15 is formed on the first metal film 13. However, the present embodiment is different from the first embodiment in that the amorphous PZT film 15 is formed only on a given region of the first metal film 13.

For example, by adopting a needle method (a method for applying minute droplets using a needle), a PZT precursor solution (the PZT sol-gel liquid) is applied to only such a given region on the first metal film 13 to form a PZT applied film, and a drying process is performed. This enables the amorphous PZT film 15 to be formed only on the given region of the first metal film 13. However, instead of the needle method, for example, another method such as an inkjet method, a screen printing method, or a transferring method may be adopted.

Figure 2C:
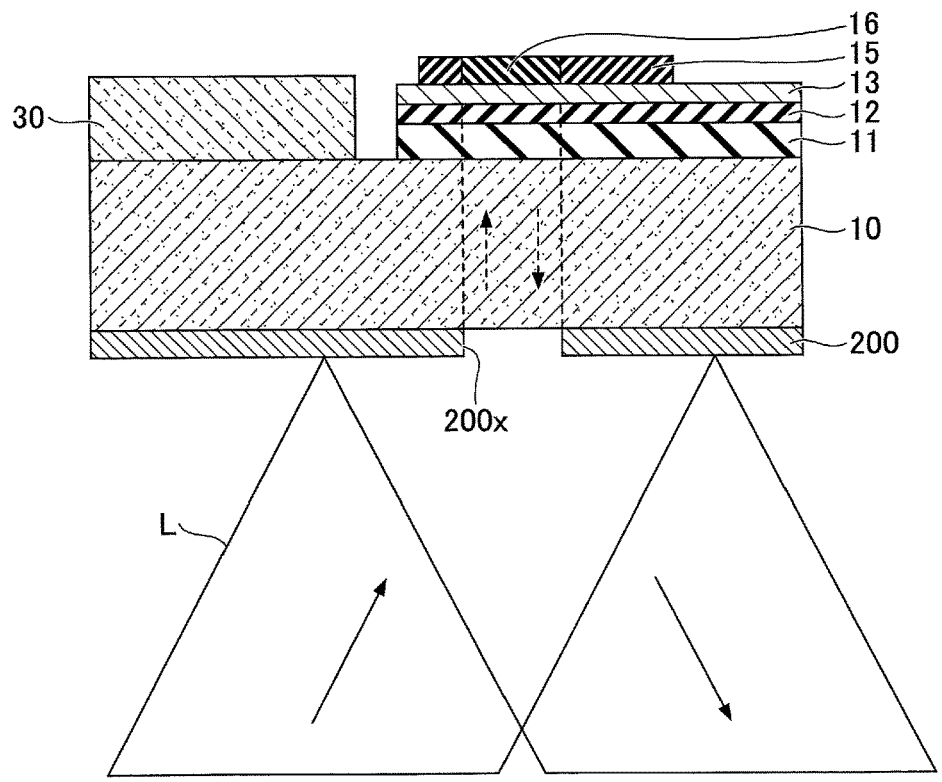
FIG. 2C is further another cross-sectional view for illustrating the crystal pattern forming method in the second embodiment.

Subsequently, in a process illustrated in FIG. 2C, in a similar manner to the process illustrated in FIG. 1O, from the back surface side of the silicon substrate 10, through the electromagnetic wave blocking layer 200, the silicon substrate 10 is irradiated with the continuously oscillating laser beam L having the wavelength of, for example, equal to or larger than approximately 1200 nm (e.g., 1470 nm). By this process, the given region of the amorphous PZT film 15 is crystallized, and thus the PZT crystal film 16 is formed. The opening portion 200x of the electromagnetic wave blocking layer 200 is not formed in a region on the back surface of the silicon substrate 10 corresponding to a region where the semiconductor element 30 is mounted. Hence, the laser beam L does not reach the region where the semiconductor element 30 is mounted. Therefore, the semiconductor element 30 is unlikely to be heated, and a property decrease of the semiconductor element 30 can be avoided.

Figure 3A:
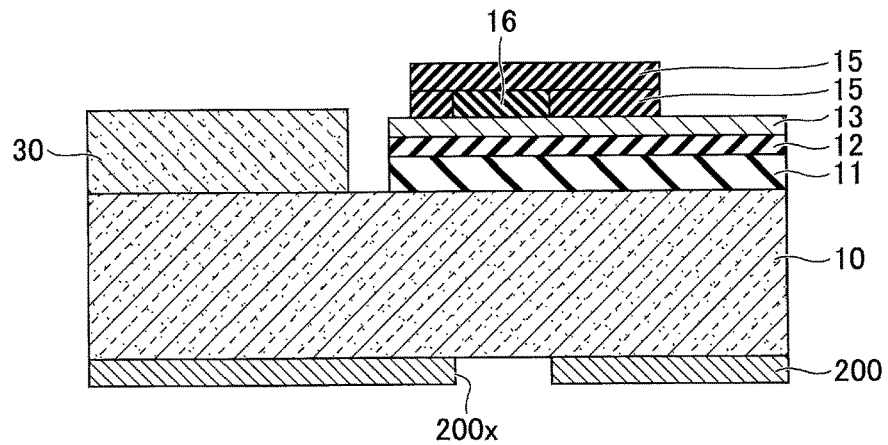
FIG. 3A is further another cross-sectional view for illustrating the crystal pattern forming method in the second embodiment.
Figure 3B:
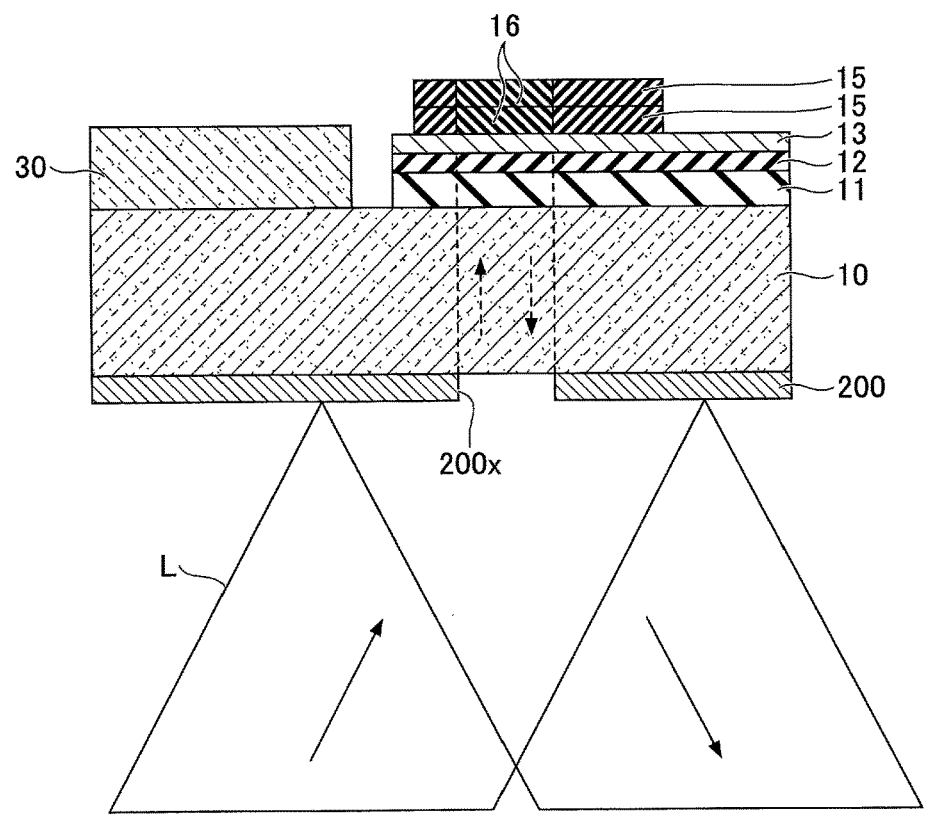
FIG. 3B is further another cross-sectional view for illustrating the crystal pattern forming method in the second embodiment.

Next, in a process illustrated in FIG. 3A, in a similar manner to the process illustrated in FIG. 2B, a second amorphous PZT film 15 is formed on the first amorphous PZT film 15 and on the PZT crystal film 16. Then, in a process illustrated in FIG. 3B, in a similar manner to the process illustrated in FIG. 2C, from the back surface side of the silicon substrate 10, through the electromagnetic wave blocking layer 200, the silicon substrate 10 is irradiated with the continuously oscillating laser beam L having the wavelength of, for example, equal to or larger than approximately 1200 nm (e.g., 1470 nm). By this process, a given region in the second amorphous PZT film 15 is crystallized, and the PZT crystal film 16 is formed. Subsequently, by repeating the processes illustrated in FIG. 3A and FIG. 3B an appropriate number of times, the PZT crystal film 16 having a desired film thickness is formed.

In the crystal pattern forming method in the second embodiment, as described above, in a similar manner to the first embodiment, the amorphous PZT film 15 serving as the target layer to be heated is locally heated and crystallized. Therefore, even in a case where the semiconductor element 30 is arranged on the silicon substrate 10, the semiconductor element 30 is unlikely to be heated, and a property decrease of the semiconductor element 30 is avoided.

Note that instead of the semiconductor element 30, even in a case where another device, for example, a sensor or a communication device is mounted on the silicon substrate 10, the same effect is available. That is to say, even in a case where another structure or another element different from the target layer to be heated is provided, another member (the above another structure or another element) that does not need a heating process is not heated. Therefore, thermal damage or misalignment in dimension accuracy due to thermal stress essentially does not occur, and a property decrease of another member is avoided.

Third Embodiment

In a third embodiment, an example of forming a recessed structure in which a reflection rate of a given region in the silicon substrate 10 is set to be relatively low, without forming the electromagnetic wave blocking layer 200, will be illustrated. To be specific, an example of selectively removing the back surface of the silicon substrate 10 to form the recessed structure (a recessed portion 10x) will be illustrated. Note that in the third embodiment, descriptions of components that are identical components to those previously defined are omitted in some cases.

Figure 4A:
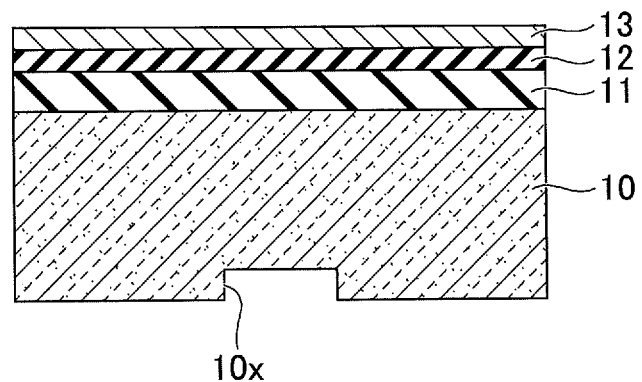
FIG. 4A is a cross-sectional view for illustrating a crystal pattern forming method in a third embodiment.
Figure 4B:
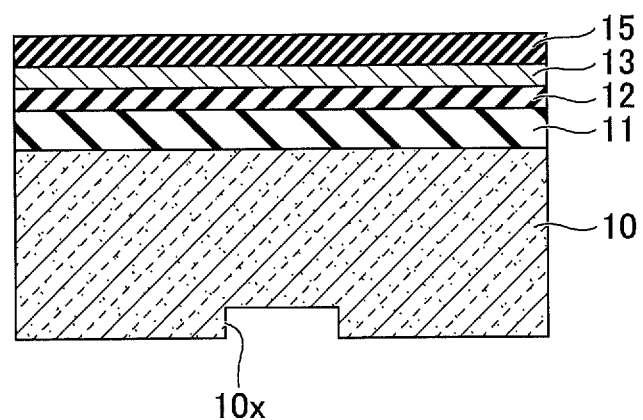
FIG. 4B is another cross-sectional view for illustrating the crystal pattern forming method in the third embodiment.
Figure 4C:
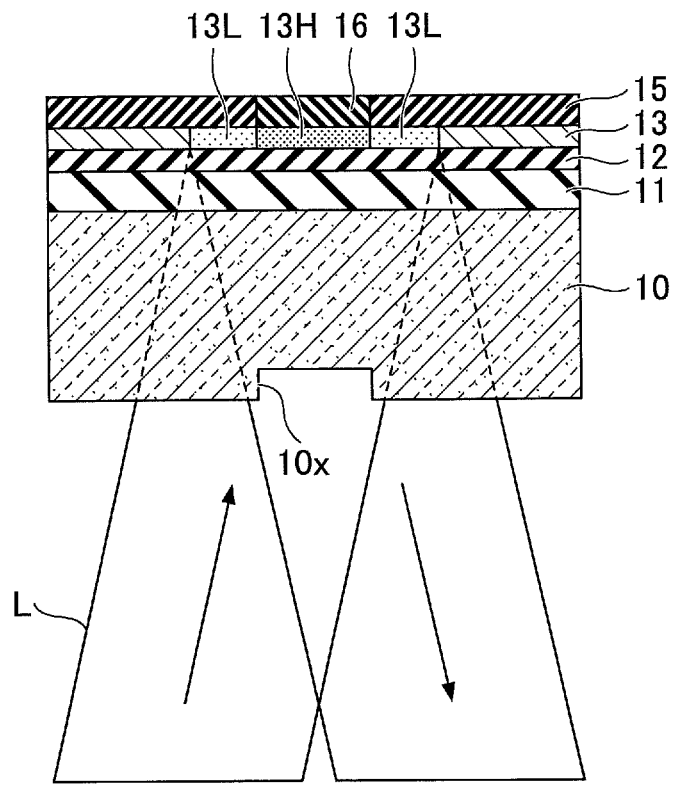
FIG. 4C is further another cross-sectional view for illustrating the crystal pattern forming method in the third embodiment.

FIG. 4A to FIG. 4C are cross-sectional views for illustrating a crystal pattern forming method in a third embodiment. First, in a process illustrated in FIG. 4A, in a similar manner to the process illustrated in FIG. 1A, on the front surface side of the silicon substrate 10, the silicon oxide film 11, the titanium oxide film 12, and the first metal film 13 (the Pt film) are sequentially stacked. In addition, the recessed portion 10x is formed on the back surface of the silicon substrate 10. Note that such a recessed structure (the recessed portion 10x) serves as one example representing the electromagnetic wave blocking mask.

The recessed portion 10x can be formed in a method where a photolithography method and a wet etching method are used together. The recessed portion 10x formed on the back surface of the silicon substrate 10 enables the reflection rate of the recessed portion 10x to be lower than a reflection rate of a region where the recessed portion 10x is not formed. The reflection rate of the recessed portion 10x is adjustable by the depth of the recessed portion 10x. By adjusting the depth of the recessed portion 10x, for example, with respect to the beam having the wavelength of 1470 nm, the reflection rate of the recessed portion 10x can be set to approximately 30% and the reflection rate of the region where the recessed portion 10x is not formed can be set to approximately 60%. Here, by adjusting the depth of the recessed portion 10x, a difference in the reflection rate between the region of the recessed portion 10x and the region where the recessed portion 10x is not provided is preferably made as large as possible.

Next, in a process illustrated in FIG. 4B, in a similar manner to the process illustrated in FIG. 1B, the amorphous PZT film 15 is formed on the first metal film 13. Subsequently, in a process illustrated in FIG. 4C, from the back surface side of the silicon substrate 10, through the recessed structure, the silicon substrate 10 is irradiated with the continuously oscillating laser beam L having the wavelength of, for example, equal to or larger than 1200 nm (e.g., 1470 nm).

In the silicon substrate 10, the reflection rate of the recessed portion 10x is relatively lower than the reflection rate in the region where the recessed portion 10x is not formed. Therefore, the intensity of the laser beam L that reaches a region 13H, which corresponds to the recessed portion 10x in the first metal film 13 serving as the electromagnetic wave absorbing layer, becomes stronger than the intensities of the laser beams L that reach adjacent regions 13L. As a result, the temperature in the region 13H is higher than the temperatures in the regions 13L. This causes the amorphous PZT film 15 on the first metal film 13 to be locally heated from the first metal film 13 side and crystallized. Thus, the PZT crystal film 16 is formed.

Note that instead of forming the recessed portion 10x formed by the etching process, a recessed structure may be formed by vapor-depositing a transparent film (e.g., SiO$_2$ or SiN) on the back surface of the silicon substrate 10 with respect to beams of a given wavelength (e.g., 1470 nm), and the reflection rate difference may be set.

As described above, instead of the electromagnetic wave blocking layer 200, the recessed structure (the recessed portion 10x) may be formed.

Fourth Embodiment

In a fourth embodiment, an example of forming a crystal pattern directly on a substrate that blocks an electromagnetic wave will be illustrated. Note that in the fourth embodiment, descriptions of components that are identical components to those previously defined are omitted in some cases.

Figure 5A:
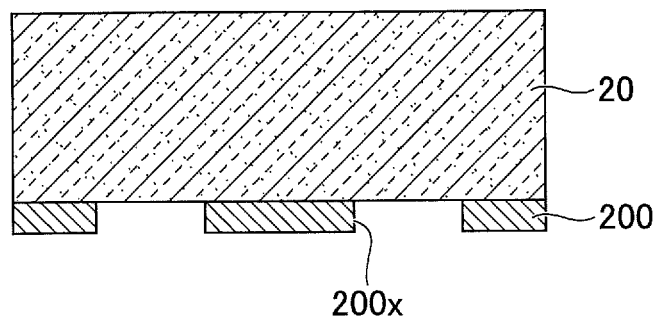
FIG. 5A is a cross-sectional view for illustrating a crystal pattern forming method in a fourth embodiment.
Figure 5B:
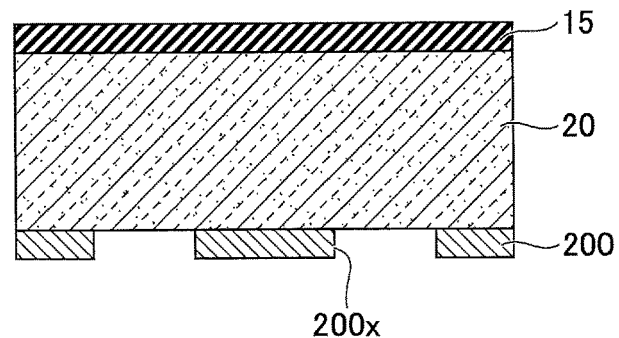
FIG. 5B is another cross-sectional view for illustrating the crystal pattern forming method in the fourth embodiment.
Figure 5C:
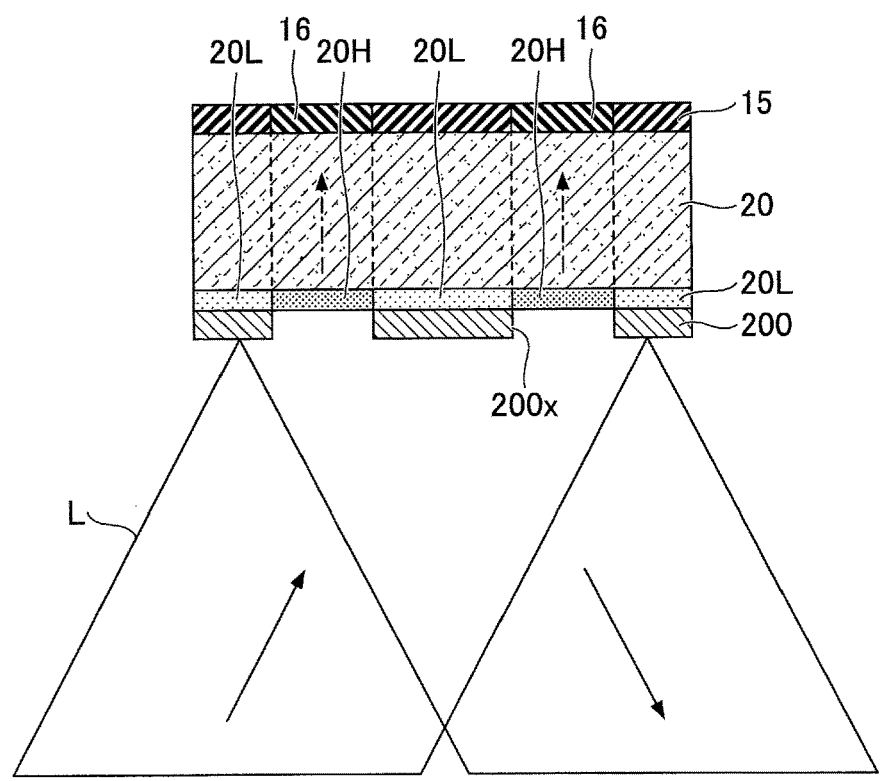
FIG. 5C is further another cross-sectional view for illustrating the crystal pattern forming method in the fourth embodiment.

FIG. 5A to FIG. 5C are cross-sectional views for illustrating a crystal pattern forming method in a fourth embodiment. First, in a process illustrated in FIG. 5A, a SUS substrate 20 having a thickness of 50 µm is prepared. On a back surface of the SUS substrate 20, the electromagnetic wave blocking layer 200 having the opening portion 200x is formed. In the present embodiment, a silicon oxide film (SiO$_2$ film) is used as the electromagnetic wave blocking layer 200. Note that in the present embodiment, none of the silicon oxide film 11, the titanium oxide film 12, or the first metal film 13 is formed on the front surface side of the SUS substrate 20.

Subsequently, in a process illustrated in FIG. 5B, in a similar manner to the process illustrated in FIG. 1B, the amorphous PZT film 15 is directly formed on the front surface of the SUS substrate 20. Then, in a process illustrated in FIG. 5C, from the back surface side of the SUS substrate 20, through the electromagnetic wave blocking layer 200, the SUS substrate 20 is irradiated with a continuously oscillating laser light L having a wavelength of, for example, 980 nm.

A metal such as SUS blocks any electromagnetic waves including the laser beam L, and does not allow any such electromagnetic waves to pass through. As illustrated in FIG. 5C, the laser beams L can enter and reach only shallow locations on the back surface side of the SUS substrate 20, for example, up to approximately 30 nm from the back surface.

In this case, the SUS substrate 20 serves as an electromagnetic wave absorbing layer. The temperatures of regions 20H (each of which is a region in the opening portion 200x) on the back surface side of the SUS substrate 20 are higher than the temperatures of regions 20L (each of which is a region covered with the electromagnetic wave blocking layer 200). The heat generated in the regions 20H transfers in directions of arrows with dot and dash lines according to heat transfer effects, and reaches the front surface side of the SUS substrate 20. This causes the amorphous PZT film 15 above the regions 20H to be locally heated from the SUS substrate 20 side and crystallized. Thus, the PZT crystal film 16 is formed.

Note that since the SUS substrate 20 has a conductive property, in a case where the structure of FIG. 5C is applied to a device, the SUS substrate 20 can be used as an electrode.

In the present embodiment, an example of using the SUS substrate 20 has been illustrated as a substrate serving as the electromagnetic wave absorbing layer. However, as an alternative to the SUS substrate 20, a substrate including a metal having a melting point that is higher than the crystallization temperature of PZT (approximately 650 degrees Celsius) may be used. Examples of such a metal include Cu, Ti, Ir, Ru, and Ni.

In the present embodiment, a laser beam having the wavelength of 980 nm has been described. However, any other laser beams, such as CO$_2$ laser having a wavelength of approximately 10.6 µm or a YAG laser having a wavelength of approximately 532 nm, may be applicable.

By using the substrate including the material of absorbing the electromagnetic waves, as described above, the crystal pattern can be directly formed on the substrate.

Fifth Embodiment

In a fifth embodiment, a piezoelectric element that has been formed by using the crystal pattern forming method in the first embodiment will be illustrated. Note that in the fifth embodiment, descriptions of components that are identical components to those previously defined are omitted in some cases.

Figure 6:
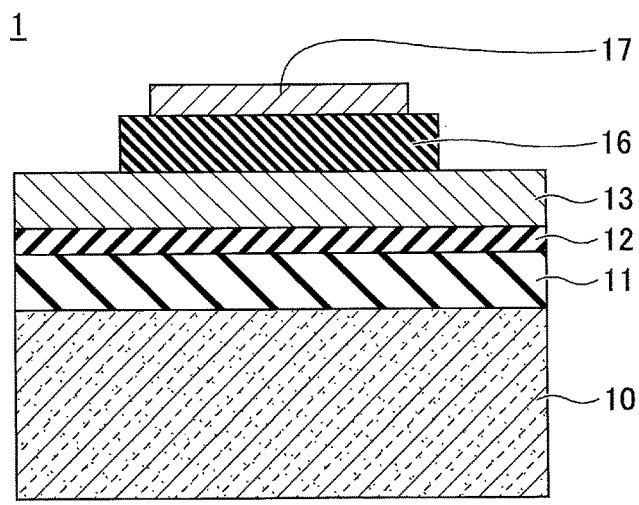
FIG. 6 is a cross-sectional view of a piezoelectric element in a fifth embodiment.

FIG. 6 is a cross-sectional view of a piezoelectric element in the fifth embodiment. As illustrated in FIG. 6, a piezoelectric element 1 includes the silicon substrate 10, the silicon oxide film 11, a titanium oxide film 12, the first metal film 13, the PZT crystal film 16, and a second metal film 17.

In the piezoelectric element 1, the first metal film 13 serves as a lower electrode, the PZT crystal film 16 serves as a piezoelectric film, and the second metal film 17 serves as an upper electrode. To be specific, when a voltage is supplied between the first metal film 13 serving as the lower electrode and the second metal film 17 serving as the upper electrode, the PZT crystal film 16 serving as the piezoelectric film is mechanically displaced.

The piezoelectric element 1 can be formed by the crystal pattern forming method in the first embodiment. To be specific, the amorphous PZT film 15 serving as the amorphous composite oxide film is formed on the first metal film 13 serving as the lower electrode. By crystallizing a given region in the amorphous PZT film 15, the PZT crystal film 16 (the piezoelectric film) serving as the composite oxide crystal film is formed. The film thickness of the PZT crystal film 16 can be set to, for example, approximately 2 µm. As described above, instead of the PZT crystal film 16, an $ABO_3$ perovskite-type crystal film may be formed.

The amorphous portions present in surroundings of the PZT crystal film 16 can be removed by, for example, a process of a photolithography method or an etching method. Since the amorphous portions are low in film density, the amorphous portions are removed by dry etching more easily than a crystal film.

After the PZT crystal film 16 is formed, the second metal film 17 serving as the upper electrode is formed on the PZT crystal film 16. As the second metal film 17, for example, a platinum film can be used. The second metal film 17 can be formed by, for example, a sputtering method or a vapor deposition method. The film thickness of the second metal film 17 can be set to, for example, approximately 100 nm.

Sixth Embodiment

In a sixth embodiment, an example of a liquid discharging head in which the piezoelectric element in the fifth embodiment is used will be illustrated. Note that in the sixth embodiment, descriptions of components that are identical components to those previously defined are omitted in some cases.

Figure 7:
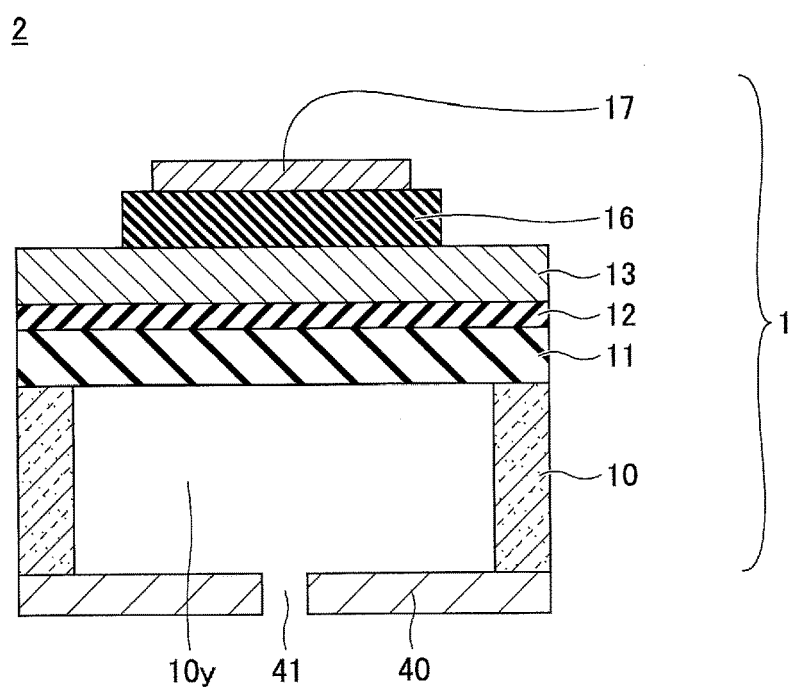
FIG. 7 is a cross-sectional view of a liquid discharging head in a sixth embodiment.

FIG. 7 is a cross-sectional view of a liquid discharging head in the sixth embodiment. As illustrated in FIG. 7, a liquid discharging head 2 includes the piezoelectric element 1 and a nozzle plate 40. The nozzle plate 40 has a nozzle 41 configured to discharge ink droplets. The nozzle plate 40 can be made of, for example, electroformed Ni.

The nozzle plate 40, the silicon substrate 10, and the silicon oxide film 11 serving as an oscillating plate constitute a pressure chamber 10y (may also referred to as an ink flow path, a compression liquid chamber, a compression chamber, a discharge chamber, or a liquid chamber) for communicating with the nozzle 41. The silicon oxide film 11 serving as the oscillating plate constitutes part of a wall surface of the ink flow path. In other words, the pressure chamber 10y is formed to communicate with the nozzle 41. The pressure chamber 10y is defined by the silicon substrate 10 (for constituting side faces), the nozzle plate 40 (for constituting a bottom face), and the silicon oxide film 11 (for constituting a top face).

The pressure chamber 10y is produced by processing the silicon substrate 10 utilizing, for example, etching. As the etching in this case, use of anisotropic etching is suited. The anisotropic etching utilizes a property that etching rates differ according to a plane orientation of a crystal structure. For example, in anisotropic etching of immersing the silicon substrate 10 in an alkali solution containing, for example, KOH, the (111) plane has an etching rate approximately $\frac{1}{100}$ the etching rate of a (100) plane. Subsequently, the nozzle plate 40 having the nozzle 41 is joined to the bottom surface of the silicon substrate 10. Note that in FIG. 7, descriptions of a liquid supplying means, a flow channel, and a fluid resistance are omitted.

The piezoelectric element 1 has a function of pressurizing ink in the pressure chamber 10y. The titanium oxide film 12 has a function of improving adhesion between the first metal film 13 serving as the lower electrode and the silicon oxide film 11 serving as the oscillating plate. Instead of the titanium oxide film 12, a film including Ti, TiN, Ta, $Ta_2O_5$, $Ta_3N_5$, or the like may be used. However, the titanium oxide film 12 may not necessarily be included in the piezoelectric element 1.

In the piezoelectric element 1, when a voltage is supplied between the first metal film 13 serving as the lower electrode and the second metal film 17 serving as the upper electrode, the PZT crystal film 16 serving as the piezoelectric film is mechanically displaced. In accordance with such a mechanical displacement of the PZT crystal film 16, the silicon oxide film 11 serving as the oscillating plate is deformed and displaced in, for example, a lateral direction (d31 direction), and pressurizes the ink in the pressure chamber 10y. This enables the ink droplets to be discharged from the nozzle 41.

Figure 8:
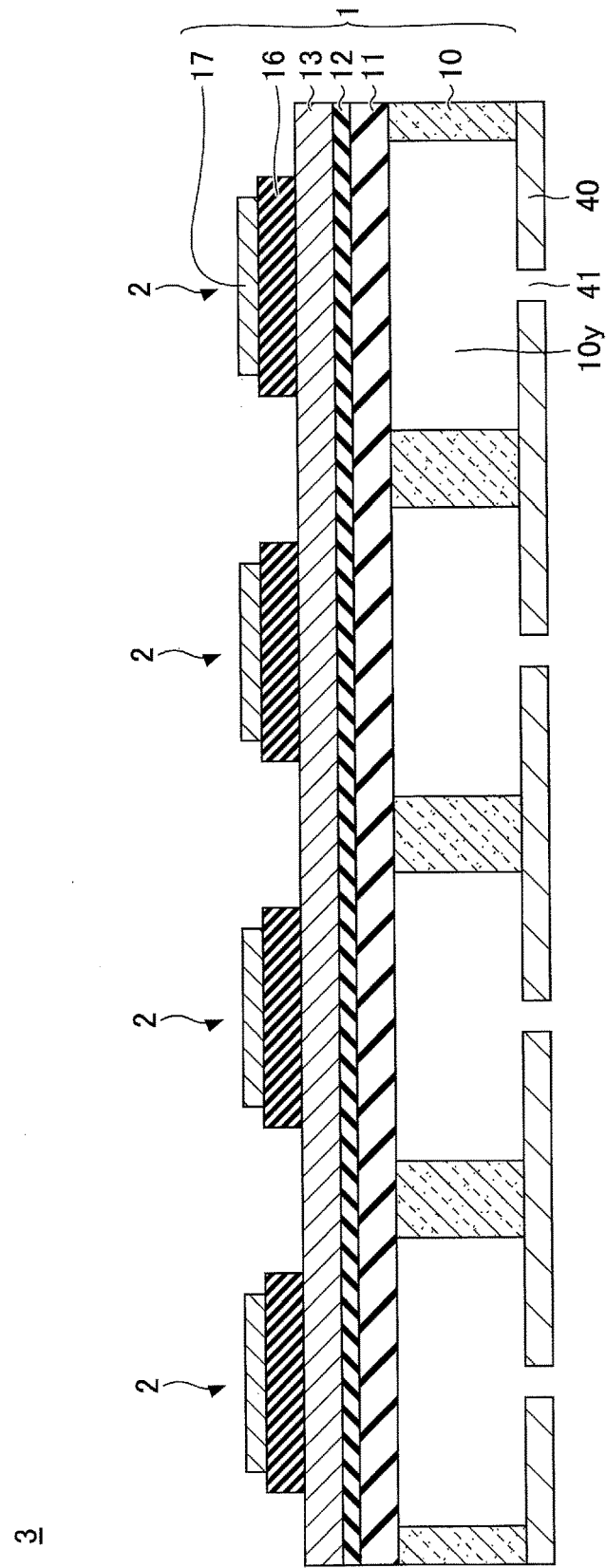
FIG. 8 is another cross-sectional view of the liquid discharging head in the sixth embodiment.

As illustrated in FIG. 8, a plurality of liquid discharging heads 2 can be provided side by side to constitute a liquid discharging head 3.

Seventh Embodiment

In a seventh embodiment, an example of a ferroelectric element that has been formed by the crystal pattern forming method in the first embodiment will be illustrated. Note that in the seventh embodiment, descriptions of components that are identical components to those previously defined are omitted in some cases.

Figure 9:
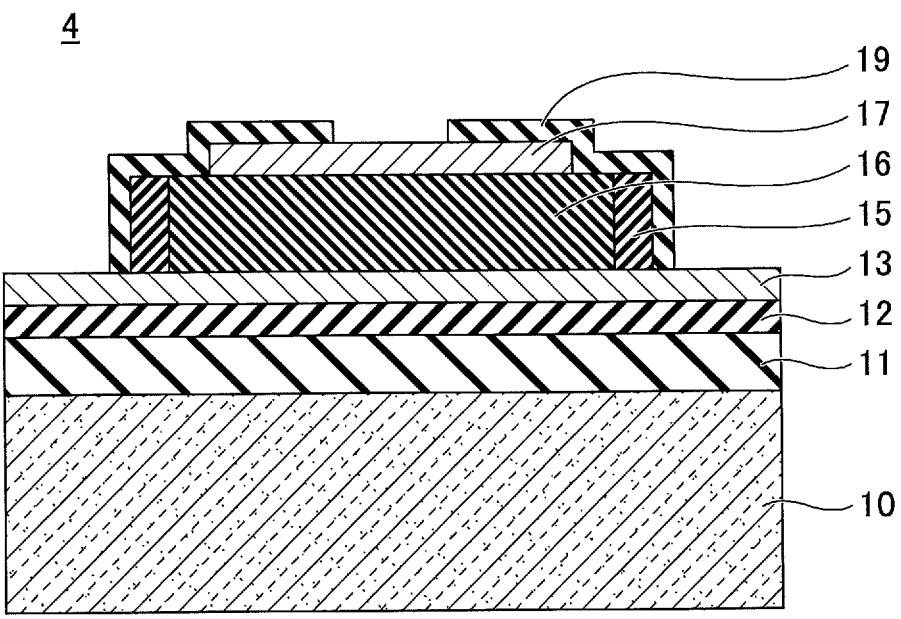
FIG. 9 is a cross-sectional view of a ferroelectric element in a seventh embodiment.

FIG. 9 is a cross-sectional view of a ferroelectric element in the seventh embodiment. As illustrated in FIG. 9, a ferroelectric element 4 includes the silicon substrate 10, the silicon oxide film 11, the titanium oxide film 12, the first metal film 13, the amorphous PZT film 15, the PZT crystal film 16, the second metal film 17, and a protective film 19. As each of the first metal film 13 and the second metal film 17, for example, a platinum film having a film thickness of, for example, approximately 100 nm can be used. Note that the amorphous PZT film 15 and the PZT crystal film 16 are formed in the same stacking process.

In the ferroelectric element 4, the PZT crystal film 16, serving as the composite oxide crystal film, is formed in a given region on the first metal film 13. The amorphous PZT film 15, serving as the amorphous composite oxide film, is formed in at least a part of the surroundings of the PZT crystal film 16. Note that the amorphous PZT film 15 has main components that are the same as the main components of the PZT crystal film 16.

In addition, in order to improve the reliability of the ferroelectric element 4, the protective film 19 is provided for continuously covering a side face and a top face of the amorphous PZT film 15, an outer edge portion on a top face of the PZT crystal film 16 (a portion where the second metal film 17 is not formed), and an outer edge portion on a top face of the second metal film 17. As the protective film 19, for example, an alumina film can be used.

FIG. 10A to FIG. 11C are cross-sectional views for illustrating a crystal pattern forming method in the seventh embodiment. First, in a process illustrated in FIG. 10A, in a similar manner to the processes in FIG. 1A to FIG. 1C, the amorphous PZT film 15 and the PZT crystal film 16 are formed on the first metal film 13 of the silicon substrate 10. Subsequently, the back surface of the silicon substrate 10 is polished to remove the electromagnetic wave blocking layer 200. Note that irradiation with the laser beam L does not make the main components in the composition of the PZT crystal film 16 differ from the main components in the composition of the amorphous PZT film 15. Note that in a single process illustrated in FIG. 1A to FIG. 1C, the crystallized film thickness of the PZT crystal film 16 is approximately 50 nm. For this reason, in a process illustrated in FIG. 10A, a process of forming the amorphous PZT film 15 and a process of heating a given region in the amorphous PZT film 15 to crystallize the given region are repeated a necessary number of times, in order to form the PZT crystal film 16 to have a certain thickness (e.g., the film thickness of 1 µm).

Figure 10B:
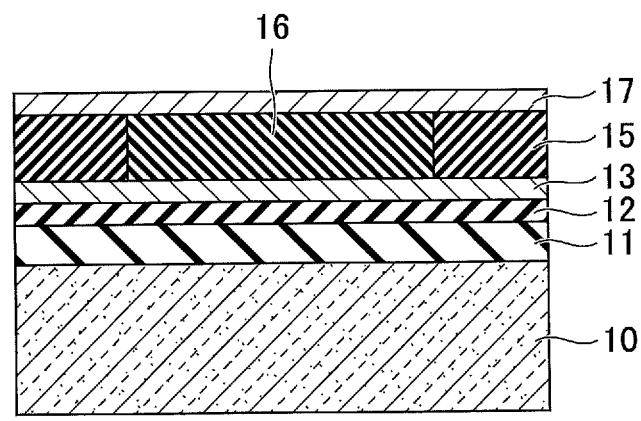
FIG. 10B is another cross-sectional view for illustrating the crystal pattern forming method in the seventh embodiment.

Next, in a process illustrated in FIG. 10B, the second metal film 17 serving as the upper electrode is formed on the amorphous PZT film 15 and on the PZT crystal film 16. The second metal film 17 can be formed by, for example, a sputtering method or a vapor deposition method. The second metal film 17 can be formed as a platinum film having a film thickness of, for example, 100 nm.

Figure 10C:
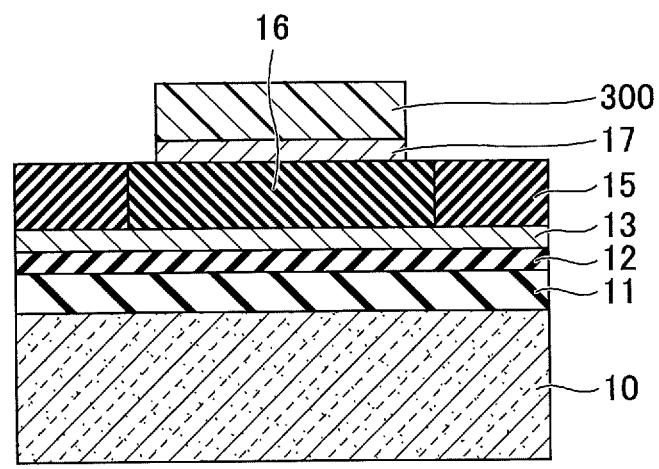
FIG. 10C is further another cross-sectional view for illustrating the crystal pattern forming method in the seventh embodiment.

Next, in a process illustrated in FIG. 10C, the second metal film 17 is patterned. To be specific, a photo-sensitive resist film 300 is formed in a given region on the second metal film 17, for example, by a photolithography method. Parts of the second metal film 17 that are not covered with the resist film 300 are removed by etching. Subsequently, the resist film 300 is removed.

Figure 11A:
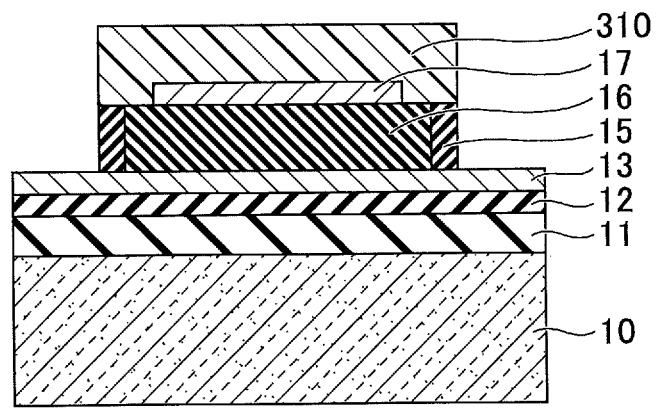
FIG. 11A is a cross-sectional view for illustrating the crystal pattern forming method in the seventh embodiment.

Next, in a process illustrated in FIG. 11A, the amorphous PZT film 15 is patterned. To be specific, for example, a photo-sensitive resist film 310 is formed in a given region on the amorphous PZT film 15, the PZT crystal film 16, and the second metal film 17 by, for example, a photolithography method, and parts of the amorphous PZT film 15 that are not covered with the resist film 310 are removed by etching. Subsequently, the resist film 310 is removed. Note that in a case where the amorphous PZT film 15 is patterned by dry etching, because the amorphous PZT film 15 is lower in density than the PZT crystal film 16, the etching rate is fast and a process time is shortened.

Figure 11B:
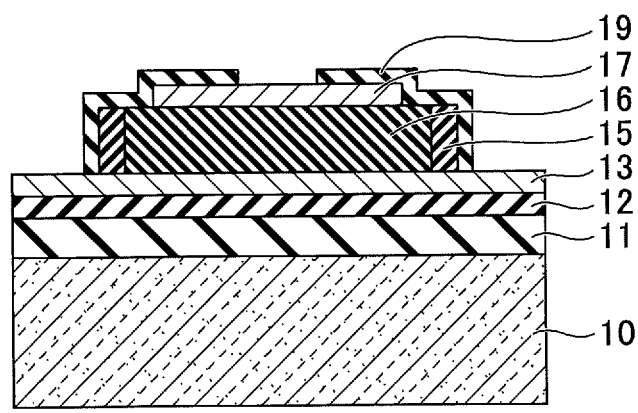
FIG. 11B is another cross-sectional view for illustrating the crystal pattern forming method in the seventh embodiment.

Next, in a process illustrated in FIG. 11B, the protective film 19 is formed for continuously covering the side face and the top face of the amorphous PZT film 15, the outer edge portion on the top face of the PZT crystal film 16 (the portion where the second metal film 17 is not formed), and the outer edge portion on the top face of the second metal film 17. As the protective film 19, for example, an alumina film can be used. The protective film 19 can be formed by, for example, a sputtering method.

Figure 11C:
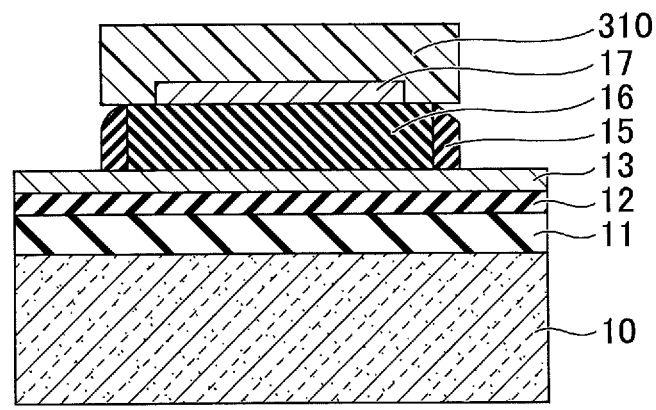
FIG. 11C is further another cross-sectional view for illustrating the crystal pattern forming method in the seventh embodiment.

Note that the amorphous PZT film 15 can also be removed by wet etching, which is easier than dry etching, in the process illustrated in FIG. 11A. In this case, it is not possible to remove the amorphous PZT film 15 by anisotropic etching and etching speed control is also difficult. Hence, as illustrated in FIG. 11C, in some cases, the size and shape of the amorphous PZT film 15 is different from the desired size and shape illustrated in FIG. 11A. However, even in this case, since the PZT crystal film 16 is not removed by etching, the properties of the ferroelectric element 4 are not affected.

As described above, the ferroelectric element 4 includes a pair of electrodes (the first metal film 13 and the second metal film 17), and the PZT crystal film 16 arranged between such a pair of electrodes and serving as the composite oxide crystal film. In at least a part of the surroundings of the PZT crystal film 16, there is provision of the amorphous PZT film 15 serving as the amorphous composite oxide film and having main components that are the same as the main components of the PZT crystal film 16.

In the ferroelectric element 4, the property of the ferroelectric element 4 depends on the PZT crystal film 16. Hence, even in a case where the amorphous PZT film 15 remains, such remaining amorphous PZT film 15 will not adversely affect the property of the ferroelectric element 4. Conversely, the amorphous PZT film 15 is capable of blocking undesirable elements from diffusing or permeating into the PZT crystal film 16 from surroundings of the PZT crystal film 16. That is to say, the amorphous PZT film 15 serves as a barrier layer, and is capable of preventing a property decrease of the ferroelectric element 4.

In addition, since the PZT crystal film 16 is originally formed by crystallizing the amorphous PZT film 15, the PZT crystal film 16 and the amorphous PZT film 15 include the same main components. Therefore, the main components have a continuous property in composition between the PZT crystal film 16 and the amorphous PZT film 15. This configuration is desirable because the crystal film has fewer defects.

Further, since the amorphous PZT film 15 is patterned, even if a side wall face of the amorphous PZT film 15 is damaged, such damage will not affect the PZT crystal film 16 and will not affect the property of the ferroelectric element 4.

Eighth Embodiment

In an eighth embodiment, another example of the ferroelectric element that has been formed by the crystal pattern forming method in the first embodiment will be illustrated. Note that in the eighth embodiment, descriptions of components that are identical components to those previously defined are omitted in some cases.

Figure 12:
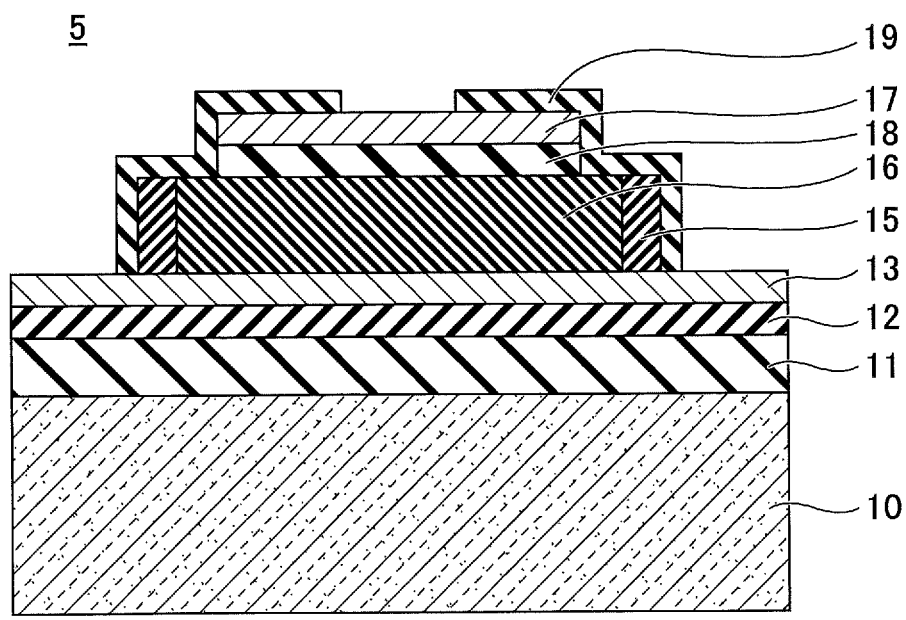
FIG. 12 is a cross-sectional view of a ferroelectric element in an eighth embodiment.

FIG. 12 is a cross-sectional view of a ferroelectric element in the eighth embodiment. As illustrated in FIG. 12, a ferroelectric element 5 is different from the ferroelectric element 4 (see FIG. 9) in that the upper electrode has a two-layered structure including a conductive oxide film 18 and the second metal film 17. As the second metal film 17, for example, a platinum film can be used. As the conductive oxide film 18, for example, a SrRuO (SRO) film can be used. To produce the ferroelectric element 5, in the process of FIG. 10B in the seventh embodiment, the conductive oxide film 18 and the second metal film 17 may be stacked sequentially in a given region on the amorphous PZT film 15.

As described above, by configuring the upper electrode to have the two-layered structure including the conductive oxide film 18 and the second metal film 17, hydrogen is prevented from diffusing into the ferroelectric element 5 from the top, and a property decrease of the ferroelectric element 5 is prevented.

Ninth Embodiment

In a ninth embodiment, an example where a silicon substrate is irradiated with a laser beam from the front surface side will be described. Note that in the ninth embodiment, descriptions of components that are identical components to those previously defined are omitted in some cases.

Figure 13A:
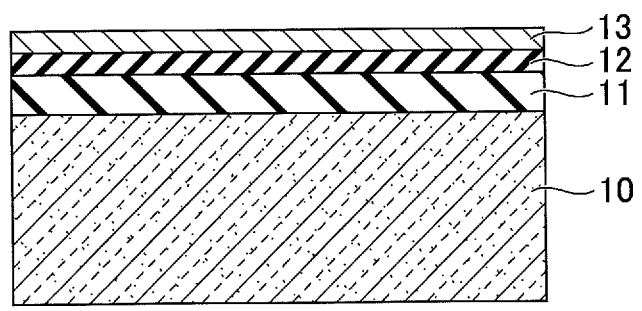
FIG. 13A is a cross-sectional view for illustrating a crystal pattern forming method in a ninth embodiment.
Figure 13B:
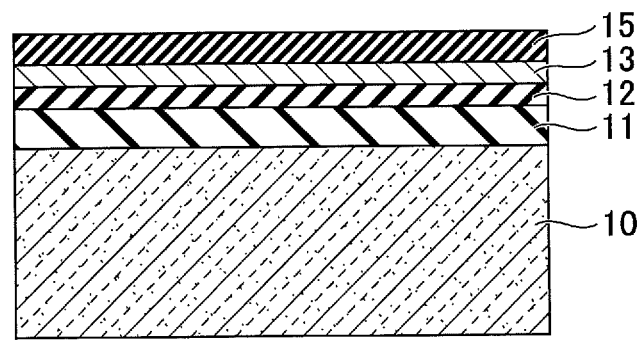
FIG. 13B is another cross-sectional view for illustrating the crystal pattern forming method in the ninth embodiment.
Figure 13C:
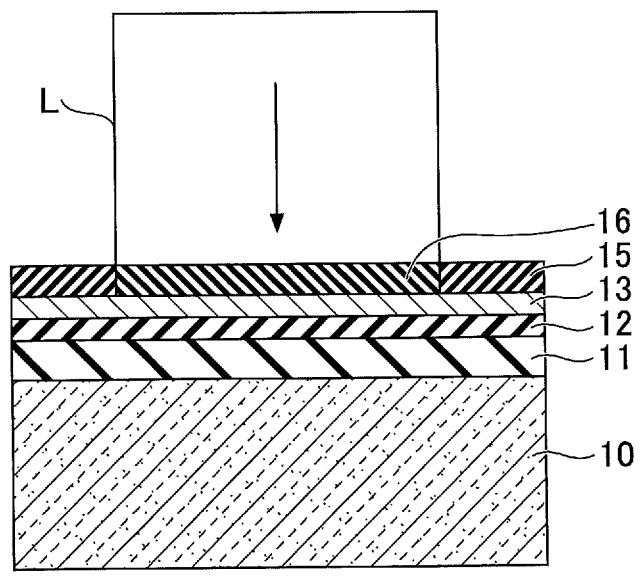
FIG. 13C is further another cross-sectional view for illustrating the crystal pattern forming method in the ninth embodiment.

FIG. 13A to FIG. 13C are cross-sectional views for illustrating a crystal pattern forming method in the ninth embodiment. First, in a process illustrated in FIG. 13A, in a similar manner to a process illustrated in FIG. 1A, on the front surface side of the silicon substrate 10, the silicon oxide film 11, the titanium oxide film 12, and the first metal film 13 are sequentially stacked. However, in the present embodiment, the electromagnetic wave blocking layer 200 is not formed on the back surface of the silicon substrate 10.

Next, in a process illustrated in FIG. 13B, in a similar manner to the process illustrated in FIG. 1B, the amorphous PZT film 15 is formed on the first metal film 13. Next, in a process illustrated in FIG. 13C, the amorphous PZT film 15 is directly irradiated with the laser beam L from the front surface side of the silicon substrate 10 to crystallize a given region in the amorphous PZT film 15, and thus the PZT crystal film 16 is formed.

In the present embodiment, the wavelength of the laser beam L that is absorbed by the amorphous PZT film 15 is selected. For example, a KrF excimer laser having a wavelength of 248 nm can be used. Note that the selected laser beam L may differ depending on the material property (absorbed wavelength) of a film that is a heated target. For example, in a case where a $SrBiTa_2O_9$ (SBT) film is the heated target, an argon laser having a wavelength of 325 nm can be selected. Subsequently, in similar processes to FIG. 10 and FIG. 11 in the seventh embodiment, the ferroelectric element 4 (see FIG. 9) or the ferroelectric element 5 (see FIG. 12) is produced.

As described above, the film that is to be the target may be directly irradiated with the laser beam.

Tenth Embodiment

In a tenth embodiment, an example of arranging the ferroelectric elements will be described. Note that in the tenth embodiment, descriptions of components that are identical components to those previously defined are omitted in some cases.

Figure 14A:
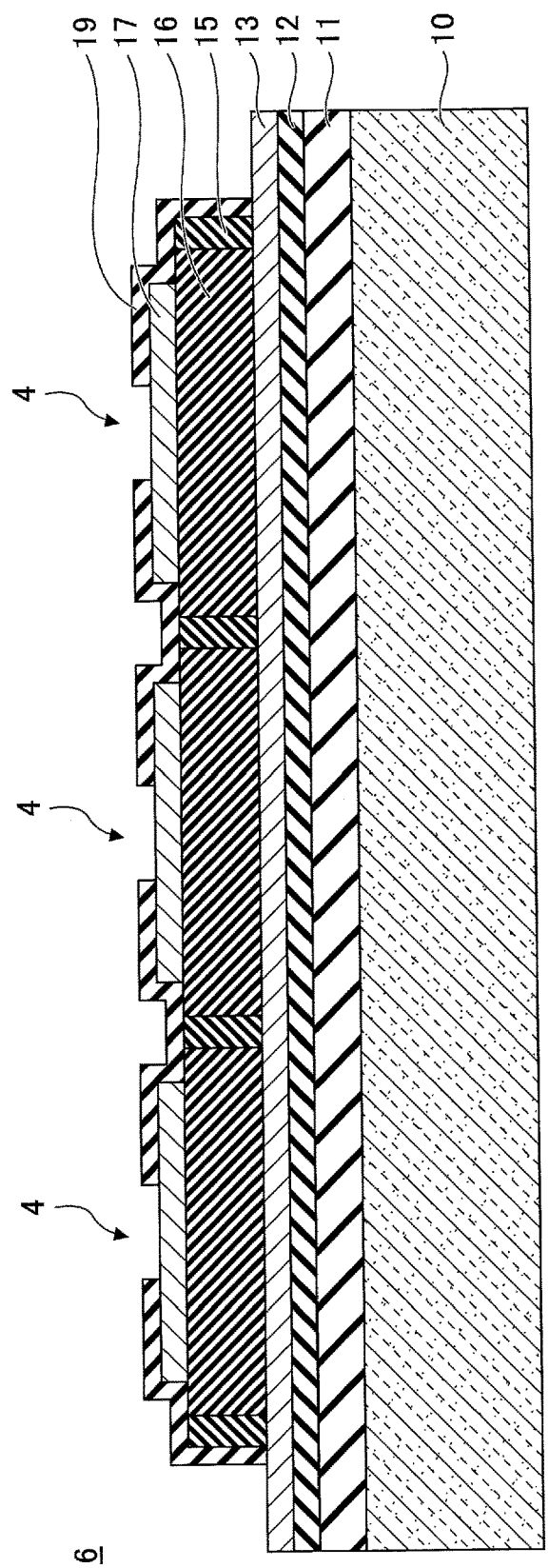
FIG. 14A is a cross-sectional view of a ferroelectric element in a tenth embodiment.
Figure 14B:
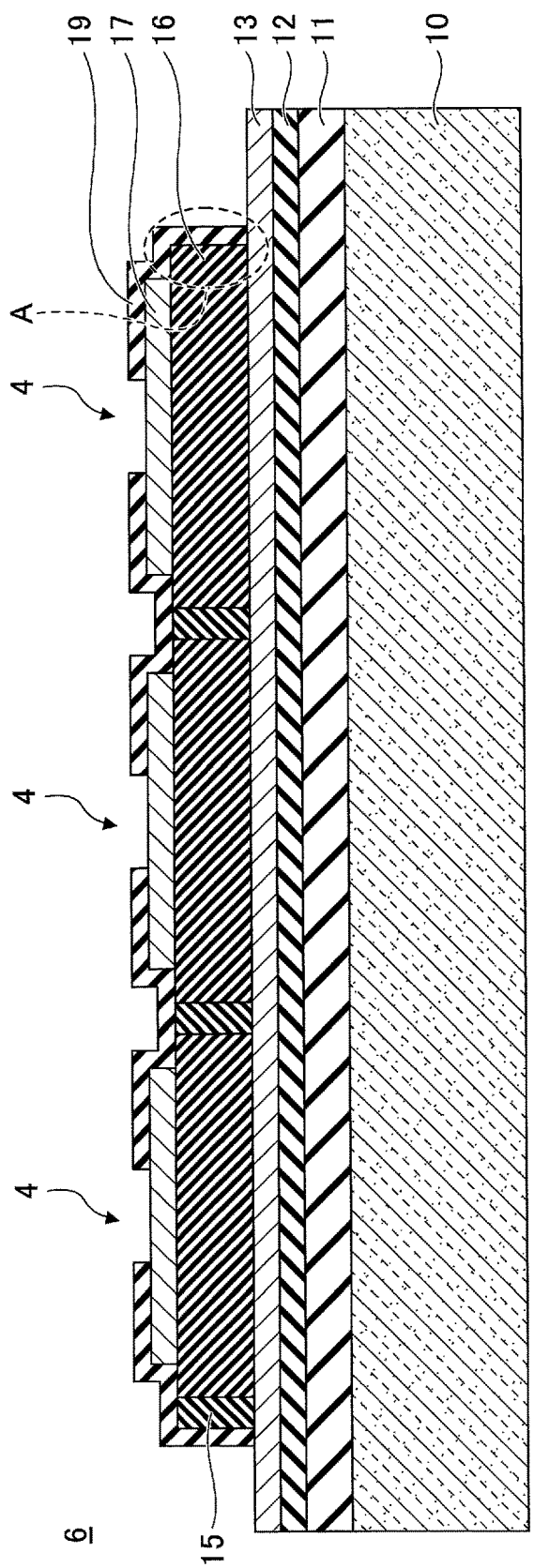
FIG. 14B is another cross-sectional view of the ferroelectric element in the tenth embodiment.

FIG. 14A and FIG. 14B are cross-sectional views illustrating a ferroelectric element in the tenth embodiment. As illustrated in FIG. 14A, in a ferroelectric element 6, the ferroelectric elements (see FIG. 9) are arranged in one dimension or in two dimensions. The amorphous PZT film 15 serving as an insulating film insulates adjacent ferroelectric elements 4.

The ferroelectric element 6 can be produced in the process illustrated in FIG. 10A to FIG. 11C in the seventh embodiment. However, there is no need to remove the amorphous PZT film 15 arranged between the adjacent ferroelectric elements 4 for exposing the first metal film 13, serving as the lower electrode. Even in a case where the amorphous PZT films 15 serving as the insulating films are present between the adjacent ferroelectric elements 4, the ferroelectric elements 4 can be independent of each other.

Since the amorphous PZT films 15 between the adjacent ferroelectric elements 4 do not need to be removed, the quantities of impurities generated during the dry etching process are significantly reduced and thus the reliability of the ferroelectric element 4 is improved. Further, since the amorphous PZT films 15 are present between the adjacent ferroelectric elements 4, there is no groove. Therefore, an alignment error occurring in the photolithography process for patterning the amorphous PZT film 15 in the process illustrated in FIG. 11A is eliminated, and thus the integration degree in the ferroelectric element 6 is increased.

In the ferroelectric element 6, the properties of the respective ferroelectric elements 4 depend on the PZT crystal films 16. Even if dimensions of its surroundings (the dimensions of the amorphous PZT films 15) are misaligned in some degree, the properties of the ferroelectric elements 4 will not change. Therefore, in the case of producing a large number of ferroelectric elements 4, the ferroelectric elements 4 are produced in a uniform manner.

Note that as indicated by a part A in FIG. 14B, by employing appropriate process conditions that do not cause damage to the PZT crystal film 16, the ferroelectric element 4 may be partially patterned to the PZT crystal film 16.

Eleventh Embodiment

In an eleventh embodiment, an infrared sensor that has been formed by the crystal pattern forming method in the seventh embodiment will be illustrated. Note that in the eleventh embodiment, descriptions of components that are identical components to those previously defined are omitted in some cases.

Figure 16:
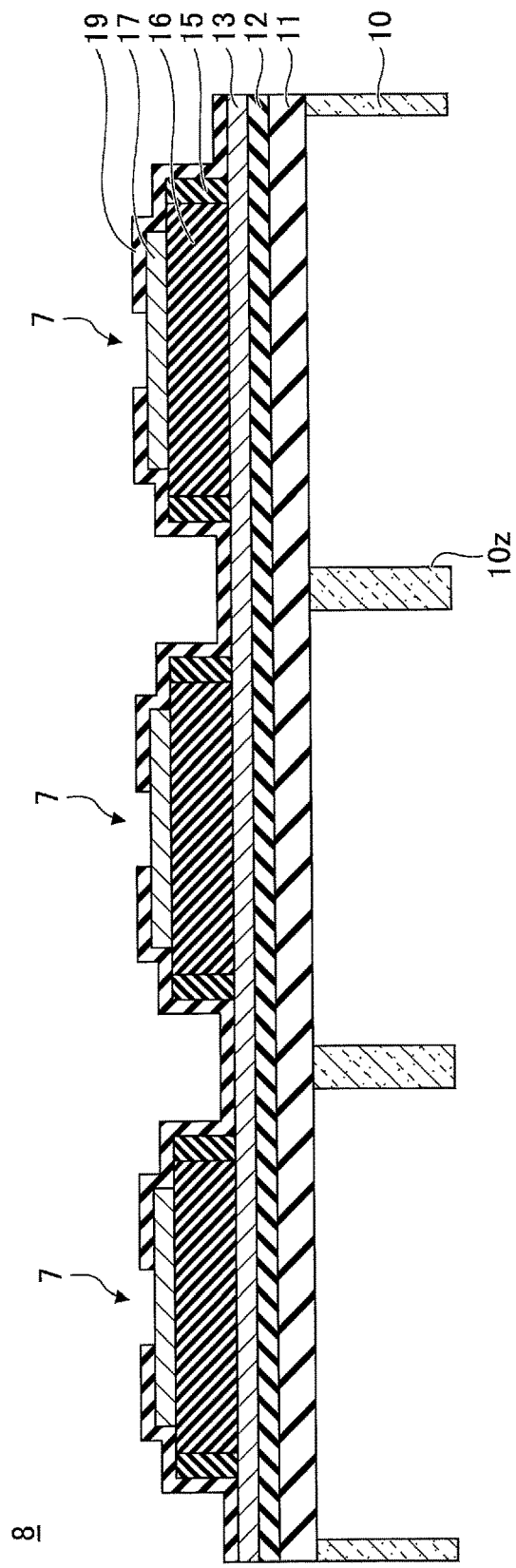
FIG. 16 is a cross-sectional view for illustrating the crystal pattern forming method in the eleventh embodiment.

FIG. 15 and FIG. 16 are cross-sectional views for illustrating a crystal pattern forming method in the eleventh embodiment. First, in a process illustrated in FIG. 15, in a similar manner to the process illustrated in FIG. 10A in the seventh embodiment, on the front surface side of the silicon substrate 10, the silicon oxide film 11, the titanium oxide film 12, and the first metal film 13 are sequentially stacked. On the back surface of the silicon substrate 10, the electromagnetic wave blocking layer 200 having the opening portions 200x is formed. Then, the amorphous PZT film 15 is formed on the first metal film 13. However, in FIG. 15, to produce a crystal array including a plurality of elements that are arranged in one dimension or in two dimensions, a plurality of opening portions 200x are formed to correspond to locations where crystals are desired to be arranged.

Then, from the back surface side of the silicon substrate 10, through the electromagnetic wave blocking layer 200, the silicon substrate 10 is irradiated with the laser beam L to crystallize a given region in the amorphous PZT film 15, and thus the PZT crystal film 16 is formed. Here, the plurality of opening portions 200x are scanned to be sequentially irradiated with the laser beam L. Note that the film thickness that can be crystallized in a single process is approximately 50 nm. For this reason, the process of forming the amorphous PZT film 15 and the process of heating a given region in the amorphous PZT film 15 to crystallize the given region are repeated a necessary number of times, in order to form the PZT crystal film 16 to have a certain thickness (e.g., the film thickness of 1 µm).

Next, in a process illustrated in FIG. 16, after a similar process illustrated in FIG. 10B to FIG. 11B in the seventh embodiment is performed, the silicon substrate 10 is polished or etched from the back surface side of the silicon substrate 10, so that a recessed portion 10z is formed below each of infrared sensors 7. In this manner, an infrared sensor 8 in which a plurality of infrared sensors 7 are arranged in one dimension or in two dimensions is completed. Note that in the present embodiment, the second metal film 17 serving as the upper electrode is formed by vapor-depositing NiCr so as to absorb infrared rays.

According to the method in the present embodiment, as described above, a plurality of infrared sensors 7 including the PZT crystal films 16 that are identical in size can be arranged. Therefore, the infrared sensor 8 (an infrared sensor array) that prevents variations in the properties between the infrared sensors 7 is produced in a stable manner.

Note that in a similar method, another device, for example, an actuator or a capacitor can be produced.

Heretofore, preferred embodiments have been described in detail. However, the present disclosure is not limited to the above-described embodiments. Various modifications, variations and alternatives should be possible within the scope of the present disclosure.

For example, the electromagnetic wave used for irradiation is not limited to the laser beam. Any type of wave is applicable as long as it can heat an electromagnetic wave absorbing layer. For example, a flash lamp can be used.

In addition, instead of the silicon substrate, a sapphire substrate may be used as a substrate.

Further, each of the piezoelectric elements in the above embodiments can be used as a component part in the liquid discharging head used in an inkjet recording apparatus, as described above. However, the use of the piezoelectric element is not limited to this. Any one of the piezoelectric elements in the above embodiments may be used as a component part in, for example, a micro pump, an ultrasonic motor, an acceleration sensor, a two-axis scanner for a projector, or an infusion pump.

What is claimed is:

1. A crystal pattern forming method comprising:
   forming an electromagnetic wave absorbing layer on a first surface of a substrate, the substrate having the first surface and a second surface, on an opposite side of the substrate from the first surface;
   forming an amorphous film on the electromagnetic wave absorbing layer;
   forming an electromagnetic wave blocking mask for blocking an electromagnetic wave on the second surface of the substrate; and
   irradiating the substrate with an electromagnetic wave blocked by the electromagnetic wave blocking mask formed on the second surface of the substrate to crystallize a given region in the amorphous film,
   wherein, in the formation of the electromagnetic wave blocking mask, a recess is formed within the second surface of the substrate, by selectively removing a portion of the second surface of the substrate.

2. A piezoelectric film producing method using the crystal pattern forming method of claim 1, wherein
   the amorphous film formed on the electromagnetic wave absorbing layer is an amorphous composite oxide film, and
   the irradiation of the substrate causes a piezoelectric film including a composite oxide crystal film to form at the given region of the amorphous composite oxide film.

3. The piezoelectric film producing method according to claim 2, wherein the composite oxide crystal film formed is an $ABO_3$ perovskite-type crystal film.

4. The piezoelectric film producing method according to claim 3, wherein the irradiation of the substrate increases a grain size of a crystal grain in the given region of the amorphous composite oxide film where the $ABO_3$ perovskite-type crystal film is formed.

5. A piezoelectric element producing method using the piezoelectric film producing method of claim 2, the piezoelectric element producing method comprising:
   forming an upper electrode on the composite oxide crystal film, subsequent to irradiating the substrate.

6. A liquid discharging head producing method for producing a liquid discharging head using a piezoelectric element produced by the piezoelectric element producing method of claim 5, the liquid discharging head producing method comprising:
   etching the substrate in an alkali solution, and
   joining the etched substrate to a nozzle plate having a nozzle, the etched substrate being joined to the nozzle plate on the second surface side of the substrate.

7. A crystal pattern forming method comprising:
   forming an amorphous film on a first surface of a substrate made of a metal, the metal substrate having the first surface and a second surface, on an opposite side of the metal substrate from the first surface;
   forming an electromagnetic wave blocking mask for blocking an electromagnetic wave on the second surface of the metal substrate; and
   irradiating the metal substrate with an electromagnetic wave blocked by the electromagnetic wave blocking mask formed on the second surface of the substrate to crystallize a given region in the amorphous film.

8. The crystal pattern forming method according to claim 7, wherein a melting point of the metal substrate is higher than a crystallization temperature of the amorphous film.

* * * * *